United States Patent
Tsai et al.

(10) Patent No.: US 6,537,144 B1
(45) Date of Patent: Mar. 25, 2003

(54) METHOD AND APPARATUS FOR ENHANCED CMP USING METALS HAVING REDUCTIVE PROPERTIES

(75) Inventors: Stan D. Tsai, Fremont, CA (US); Yuchun Wang, Cupertino, CA (US); Kapila Wijekoon, Santa Clara, CA (US); Rajeev Bajaj, Fremont, CA (US); Fred C. Redeker, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/505,899

(22) Filed: Feb. 17, 2000

(51) Int. Cl.$^7$ .............................................. B24D 11/00
(52) U.S. Cl. ........................ 451/526; 451/533; 451/538; 451/539
(58) Field of Search ................................ 451/526, 533, 451/538, 539, 41

(56) References Cited

U.S. PATENT DOCUMENTS

| | | | |
|---|---|---|---|
| 3,162,588 A | 12/1964 | Bell | 204/141 |
| 3,873,512 A | 3/1975 | Latanision | 204/129.46 |
| 4,125,444 A | 11/1978 | Inoue | 204/129.43 |
| 4,793,895 A | 12/1988 | Kaanta et al. | 156/627 |
| 4,839,993 A | 6/1989 | Masuko et al. | 51/159 |
| 4,934,102 A | 6/1990 | Leach et al. | 51/50 R |
| 4,954,141 A | 9/1990 | Takiyama et al. | 51/296 |
| 4,956,056 A | 9/1990 | Zubatova et al. | 204/129.43 |
| 5,217,586 A | 6/1993 | Datta et al. | 204/129.6 |
| 5,225,034 A | 7/1993 | Yu et al. | 156/636 |
| 5,478,435 A | 12/1995 | Murphy et al. | 156/636.1 |
| 5,534,106 A | 7/1996 | Cote et al. | 156/636.1 |
| 5,543,032 A | 8/1996 | Datta et al. | 205/670 |
| 5,567,300 A | 10/1996 | Datta et al. | 205/652 |
| 5,575,706 A | 11/1996 | Tsai et al. | 451/41 |
| 5,578,362 A | 11/1996 | Reinhardt et al. | 428/147 |
| 5,807,165 A * | 9/1998 | Uzoh et al. | 451/41 |
| 5,840,629 A | 11/1998 | Carpio | 438/692 |
| 5,846,882 A | 12/1998 | Birang | 438/692 |

(List continued on next page.)

FOREIGN PATENT DOCUMENTS

| | | | | |
|---|---|---|---|---|
| JP | P2001-77117 A | 3/2001 | ....... | H01L/21/3205 |
| WO | WO 98/49723 | 11/1998 | ......... | H01L/21/321 |
| WO | WO 00/26443 | 5/2000 | | |
| WO | WO 00/59682 | 10/2000 | ........... | B24B/37/04 |

Primary Examiner—Joseph J. Hail, III
Assistant Examiner—David B. Thomas
(74) Attorney, Agent, or Firm—Moser, Patterson & Sheridan

(57) ABSTRACT

Dishing in chemical mechanical polishing (CMP) is reduced by introducing a material that balances electrochemical forces. In a first embodiment of the invention, a polishing pad having copper material in grooves on the polishing pad surface is used in the polishing process to reduce dishing. In a second embodiment of the invention, the polishing pad has perforations with copper fillings. In a third embodiment of the invention, a copper retaining ring on the polishing head introduces copper material to the CMP process to reduce dishing. In a fourth embodiment of the invention, a conditioning plate of copper is used in the polishing apparatus. In a fifth embodiment of the invention, additional copper features are placed on the substrate to be polished. The polishing of the additional features introduces copper steadily through the polishing process. In a sixth embodiment of the invention, copper compounds are added to the polish slurry.

32 Claims, 7 Drawing Sheets

U.S. PATENT DOCUMENTS

| | | | |
|---|---|---|---|
| 5,871,392 A | | 2/1999 | Meikle et al. ................. 541/56 |
| 5,882,251 A | * | 3/1999 | Berman et al. ............. 451/527 |
| 5,911,619 A | | 6/1999 | Uzoh et al. ..................... 451/5 |
| 5,938,801 A | | 8/1999 | Robinson ..................... 51/306 |
| 6,001,008 A | | 12/1999 | Fujimori et al. ............ 451/443 |
| 6,004,880 A | | 12/1999 | Liu et al. ..................... 438/692 |
| 6,017,265 A | | 1/2000 | Cook et al. ................... 451/41 |
| 6,066,030 A | | 5/2000 | Uzoh ......................... 4510/41 |
| 6,077,337 A | | 6/2000 | Lee ................................ 106/3 |
| 6,090,239 A | | 7/2000 | Liu et al. ..................... 156/345 |
| 6,103,096 A | | 8/2000 | Datta et al. ................. 205/686 |
| 6,116,998 A | * | 9/2000 | Damgaard et al. .......... 451/490 |
| 6,153,043 A | | 11/2000 | Edelstein et al. ........... 156/345 |
| 6,165,904 A | * | 12/2000 | Kim ........................... 438/692 |
| 6,171,467 B1 | | 1/2001 | Weihs et al. .................... 205/93 |
| 6,176,992 B1 | | 1/2001 | Talieh ........................ 205/87 |
| 6,203,413 B1 | * | 3/2001 | Skrovan ...................... 451/72 |
| 6,210,257 B1 | | 4/2001 | Carlson ....................... 451/56 |
| 6,234,870 B1 | | 5/2001 | Uzoh et al. ..................... 451/8 |
| 6,238,271 B1 | | 5/2001 | Cesna ......................... 451/41 |
| 6,238,592 B1 | | 5/2001 | Hardy et al. ............... 252/79.1 |
| 6,273,798 B1 | | 8/2001 | Berman ....................... 451/72 |
| 6,381,169 B1 | | 4/2002 | Bocian et al. .............. 365/151 |
| 6,386,956 B1 | | 5/2002 | Sato et al. .................... 451/57 |
| 2001/0024878 A1 | | 9/2001 | Nakamura .................. 438/691 |
| 2001/0036746 A1 | | 11/2001 | Sato et al. .................. 438/745 |
| 2001/0042690 A1 | | 11/2001 | Talieh ........................ 205/118 |

* cited by examiner

METHOD AND APPARATUS FOR ENHANCED CMP USING METALS HAVING REDUCTIVE PROPERTIES

RELATED APPLICATIONS

This application is related to co-pending U.S. patent application Ser. No. 09/910,425 (AMAT/3836.P1), filed on Jul. 20, 2001, and U.S. patent application Ser. No. 09/563,628, (AMAT/3836.P1) filed on May 2, 2000.

FIELD OF THE INVENTION

This invention relates generally to planarization of substrates and more particularly to chemical mechanical polish of metal substrates.

BACKGROUND OF THE INVENTION

Integrated circuits are typically formed on substrates, particularly silicon wafers, by the sequential deposition of conductive, semiconductive or insulative layers. After a layer is deposited, the layer is etched to create circuitry features. As a series of layers are sequentially deposited and etched, the outer or uppermost surface of the substrate, i.e., the exposed surface of the substrate, becomes increasingly non-planar. This non-planar outer surface presents a problem for the integrated circuit manufacturer. Therefore, there is a need to periodically planarize the substrate surface to provide a relatively flat surface. In some fabrication processes, planarization of the outer layer should not expose underlying layers.

Chemical mechanical polishing (CMP) is one method of planarization. This planarization method typically requires that the substrate be mounted on a carrier or polishing head. The exposed surface of the substrate is placed against a polishing pad. The polishing pad may be either a "standard" pad or a fixed-abrasive pad. A fixed-abrasive pad has abrasive particles held in a containment media, whereas a standard pad has a durable surface, without embedded abrasive particles. The carrier head provides a controllable load, i.e., pressure, on the substrate to push it against the polishing pad. A polishing slurry, including at least one chemically-reactive agent, and abrasive particles if a standard pad is used, is supplied to the surface of the polishing pad.

An effective CMP process not only provides a high polishing rate, but also provides a substrate surface which is finished and flat. The polishing rate, finish and flatness are determined by the pad and slurry combination, the relative speed between the substrate and pad, and the force pressing the substrate against the pad.

In applying conventional planarization techniques, such as CMP, it is extremely difficult to achieve a high degree of surface planarity. The metal features on the substrate are typically formed in an interlayer dielectric, such as silicon oxide layer, by a damascene technique wherein trenches are initially formed. A barrier layer, such as a tantalum-containing layer e.g. Ta, TaN, or alternatively titanium (Ti or TiN), is then deposited lining the trenches and on the upper surface of the silicon oxide interlayer dielectric. Copper or a copper alloy is then deposited, as by electroplating, electroless plating, physical vapor deposition (PVD) at a temperature of about 50° C. to about 150° C. or chemical vapor deposition (CVD) at a temperature under about 200° C., typically at a thickness of about 8000 Å to about 18,000 Å. The deposited copper is chemically oxidized and then removed using CMP to create features on the metal substrate.

In planarizing the wafer surface after copper metallization using CMP, undesirable erosion and dishing typically occur, decreasing the degree of surface planarity and challenging the depth of focus limitations of conventional photolithographic techniques, particular with respect to achieving submicron dimensions, such as about 0.25 micron. In addition, dishing reduces the size of circuit lines thereby increasing resistivity. Erosion is defined as the height differential between the oxide in the open field and the height of the oxide within the circuit array. Dishing is defined as a difference in height between the oxide and Cu in a feature (i.e. in a line or pad).

Dishing is caused, in general, by differences in hardness and chemical interaction across a surface. The mechanical and chemical interactions between the polishing pad and slurry and copper are different from the mechanical and chemical interactions between the polishing pad and slurry and oxide.

One of the causes of increased dishing arises from the difference in electrochemical potential between copper and barrier layer material. As the copper removal process approaches the copper/barrier interface, the substrate surface has both copper areas and barrier areas. An electrochemical effect takes place at the copper/barrier interface because of the electrochemical potential differential. The effect causes enhanced removal of copper in surface features and therefore causes higher dishing.

A second cause of increased dishing is the chemical loading effect. As the amount of copper is cleared from the surface, the ratio of polishing chemical in the slurry to copper on the substrate increases. This change in the chemical equilibrium of the CMP process in turn, enhances copper removal at surface features on the substrate.

It remains desirable to have a process of planarization where dishing is decreased.

It is an advantage of the present invention to provide a method and apparatus for substrate planarization producing a good quality substrate surface.

SUMMARY OF THE INVENTION

The problems of reducing dishing while achieving planarized processed substrates are solved by the present invention of a polish pad embedded with metal material having reductive properties for chemical mechanical polish.

Dishing in chemical mechanical polishing (CMP) is reduced by introducing a material that balances electrochemical forces. In a first embodiment of the invention, a polishing pad having copper material in grooves on the polishing pad surface is used in the polishing process to reduce dishing. In a second embodiment of the invention, the polishing pad has perforations with copper fillings. In a third embodiment of the invention, a copper retaining ring on the polishing head introduces copper material to the CMP process to reduce dishing. In a fourth embodiment of the invention, a conditioning plate of copper is used in the polishing apparatus. In a fifth embodiment of the invention, additional copper features are placed on the substrate to be polished. The polishing of the additional features introduces copper steadily through the polishing process. In a sixth embodiment of the invention, copper compounds are added to the polish slurry.

The present invention together with the above and other advantages may best be understood from the following detailed description of the embodiments of the invention illustrated in the drawings, wherein:

DETAILED DESCRIPTION OF PREFERRED EMBODIMENTS

Figure 1:
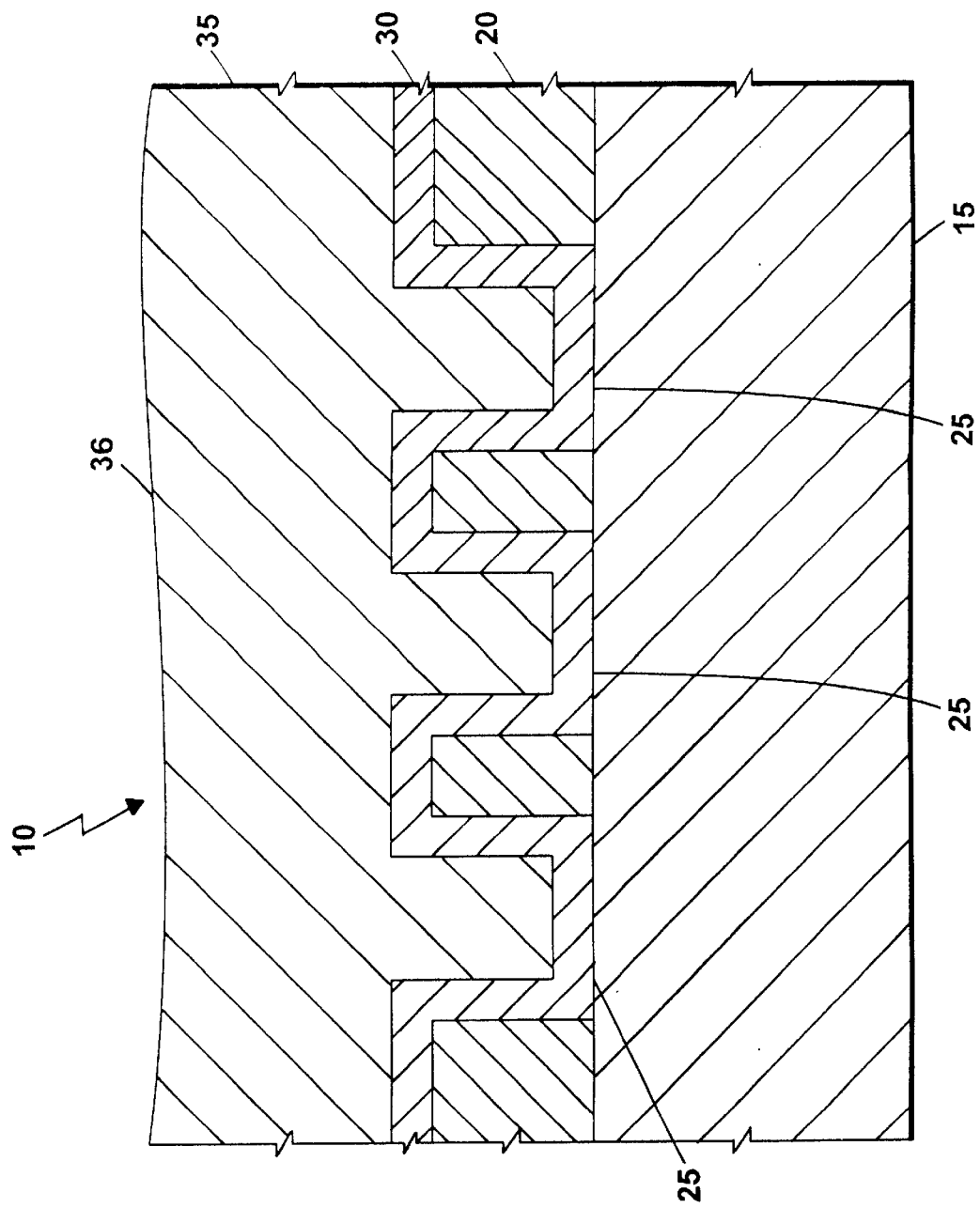
FIG. 1 is a cross-sectional view of a substrate with a plurality of layers.

FIG. 1 shows a cross-sectional view of a conductive substrate 10 having deposited layers such as those layers formed during the manufacture of semiconductors. The figure is not to scale. An interlayer dielectric 20, e.g. silicon oxide, is formed overlying a metal layer 15. A plurality of indentations, also referred to as openings 25, are formed in a designated area at the left of the interlayer dielectric 20 in which an array of conductive lines are to be formed bordering an open field shown on the right of the interlayer dielectric 20. A barrier layer 30, e.g. tantalum, tantalum nitride, titanium or titanium nitride, is deposited on the layer of interlayer dielectric 20, the barrier layer 30 also lining the plurality of openings 25. A conductive layer 35, e.g. copper, is then deposited over the barrier layer 30. Successive process steps require that portions of the conductive layer be removed. Planarization and selective removal of the conductive layer are accomplished in a polishing step.

Figure 2:
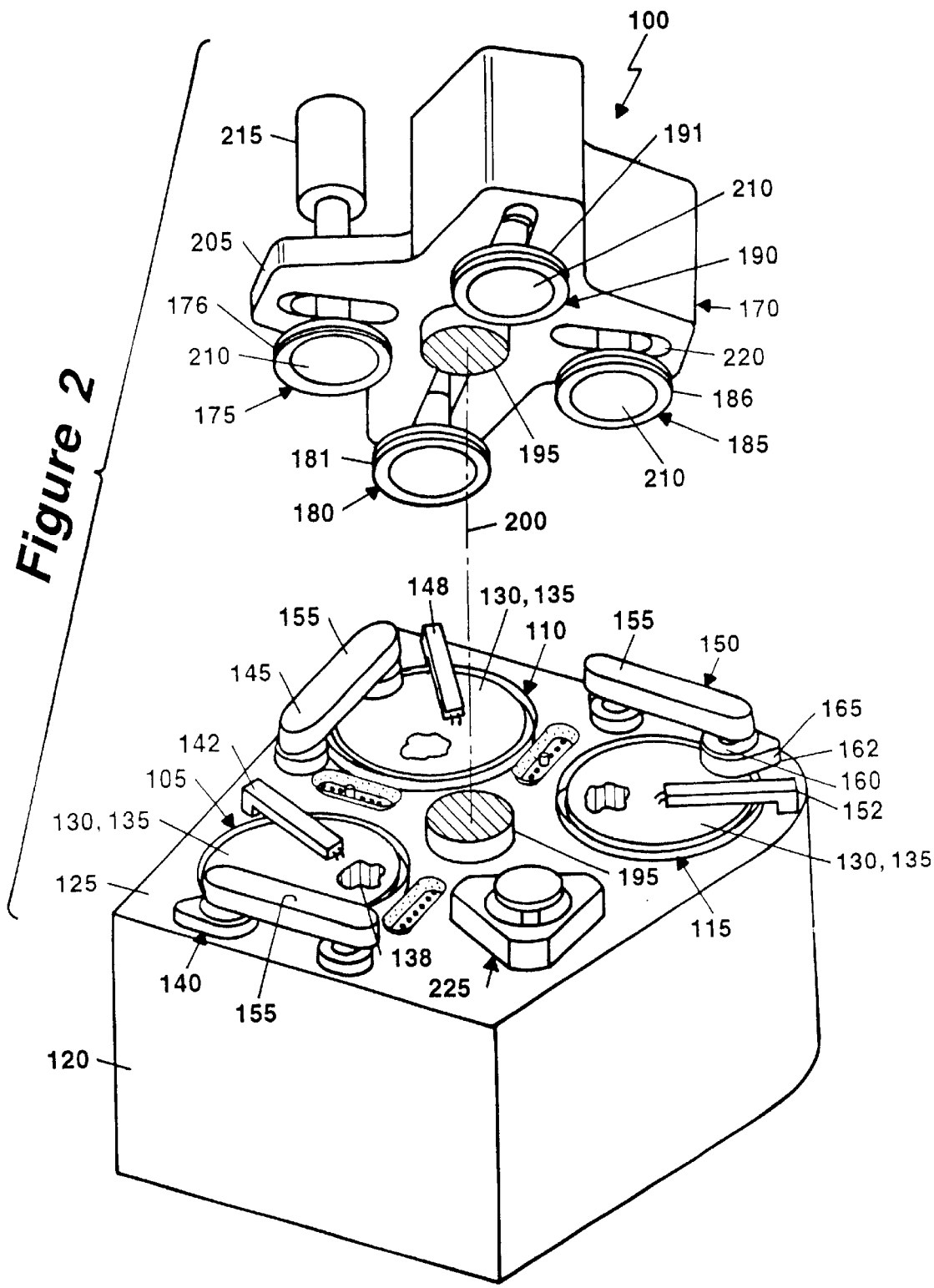
FIG. 2 is a pictorial exploded view of a chemical mechanical polishing apparatus incorporating aspects of the present invention.

FIG. 2 shows a chemical mechanical polishing apparatus 100 having a plurality of polishing stations 105, 110, 115. The polishing apparatus includes a lower machine base 120 with a table top 125 mounted thereon having the plurality of polishing stations 105, 110, 115. Each polishing station 105, 110, 115 includes a rotatable platen 130 on which is placed a polishing pad 135, and it further includes an associated pad conditioner apparatus 140, 145, 150, each with a rotatable arm 155 holding a conditioner head 160 and an associated washing basin 165 for the conditioner head 155. Each polishing station 105, 110, 115 further includes a slurry arm 142, 148, 152 for delivering polishing slurry.

A rotatable multi-head carousel 170 includes four wafer head systems 175, 180, 185, 190 which receive and hold wafers and polish the wafers by pressing them against respective polishing pads 135 held on the platens 130 at the respective polishing stations 105, 110, 115. Each wafer head system 175, 180, 185, 190 has a retaining ring 176, 181, 186, 191 for retaining the wafer during polish. The carousel 170 is supported on a center post 195 and is rotated thereon about a carousel axis 200 by a motor assembly located within the base 120.

The four identical wafer head systems 175, 180, 185, 190 are mounted on a carousel support plate 205 at equal angular intervals about the carousel axis 200. The center post 195 centrally supports the carousel support plate 205 and allows the carousel motor to rotate the carousel support plate 205, the wafer head systems 175, 180, 185, 190, and the wafers attached thereto about the carousel axis 200. Each wafer head system 175, 180, 185, 190 includes a wafer head 210 that is rotated about its own axis by a head-rotation motor 215 connected to it by a shaft. The heads 210 can rotate independently as driven by their dedicated head-rotation motors 215, and can further independently oscillate radially in slots 220 formed in the carousel support plate 205. Raising or lowering wafers attached to the bottom of the wafer heads 210 is performed within the wafer head systems 175, 180, 185.

During the actual polishing, the wafer heads 210 of three of the wafer head systems, e.g., 175, 180, 185, are positioned at and above respective polishing stations 105, 110, 115, each having an independently rotatable platen 130 supporting a polishing pad 135 whose surface is wetted with an abrasive slurry which acts as the media for polishing the wafer. During polishing, the wafer head systems 175, 180, 185 independently oscillate along respective radii of the carousel 170 so that the associated wafer heads 210 move along a diameter of a respective polishing pad 135. In a typical process, the sweep axis of a wafer heads 210 is aligned to the center of the polishing pad 135.

In use, the wafer head 210, for example, that of the fourth wafer head system 190, is initially positioned above the wafer transfer station 225. When the carousel 170 is rotated, it positions different wafer head systems 175, 180, 185, 190 over the polishing stations 105, 110, 115 and the transfer station 225. The carousel 170 allows each wafer head system 175, 180, 185, 190 to be sequentially located first over the transfer station 225, then over one or more of the polishing stations 105, 110, 115, and then back to the transfer station 225.

Each polishing pad 135 can be continuously or periodically conditioned by one of the pad conditioner apparatus 140, 145, 150, each having an independently rotating conditioner head 160 attached to the conditioner arm 155. An abrasive conditioning plate 162 or a similar conditioning surface is included at the bottom of the conditioner head 160. The arm 155 sweeps the conditioner head 160 across the associated polishing pad 135 in an oscillatory motion generally between the center of the polishing pad 135 and its perimeter. The conditioner head 160 is pressed against the pad 135 to abrade and condition the pad so that it thereafter effectively polishes any wafer pressed against it while it is rotating.

Figure 3:
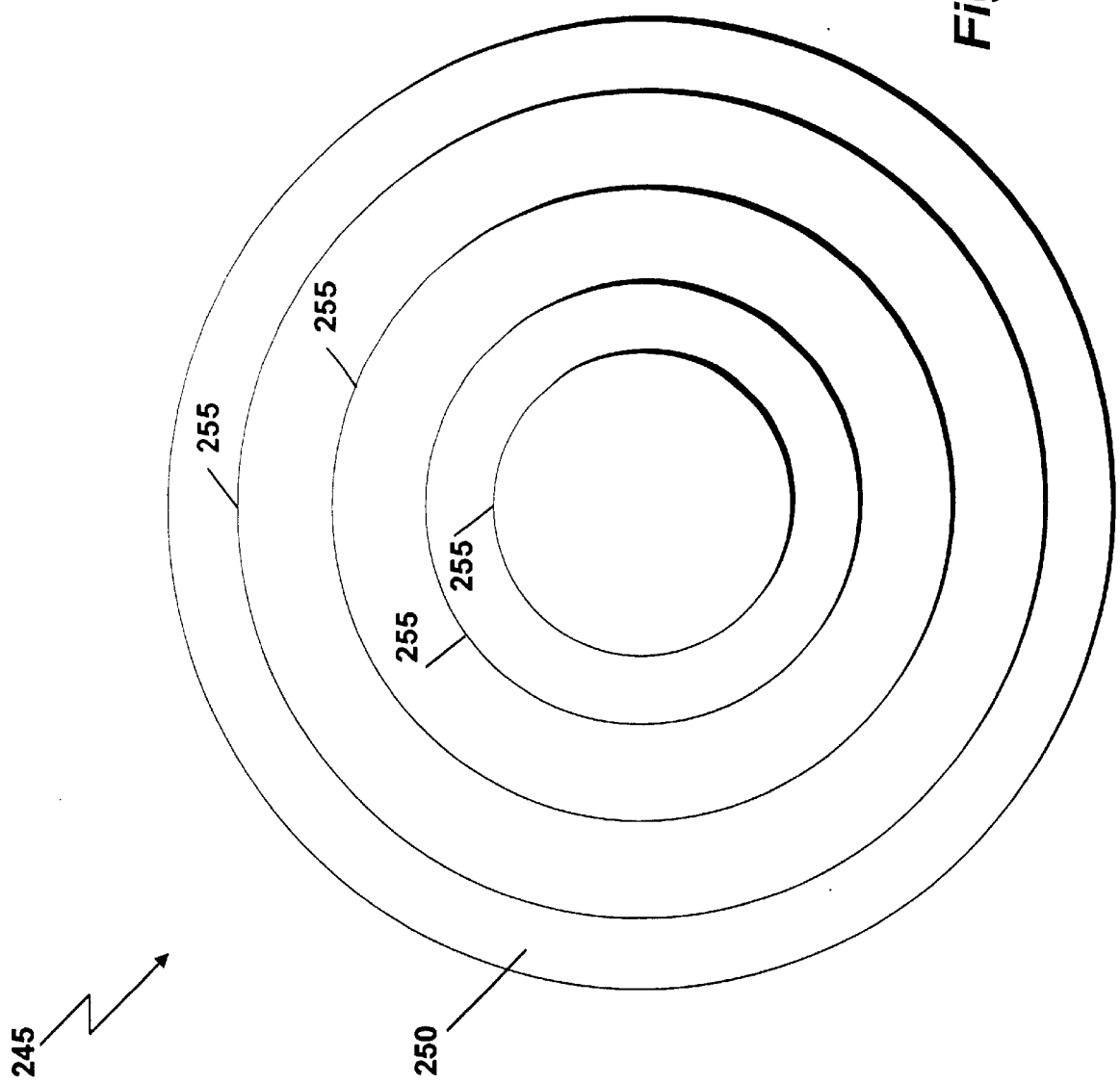
FIG. 3 is a top view of a polishing pad having copper-filled grooves according to the principles of the invention.

FIG. 3 is a top view of a surface 250 of a polishing pad 245 having embedded copper of a first embodiment of the present invention. The polishing pad may be either a "standard" pad or a fixed-abrasive pad. A fixed-abrasive pad has abrasive particles held in a containment media, whereas a standard pad has a durable surface, without embedded abrasive particles. The polishing pad surface 250 has a series of concentric grooves 255. The grooves 255 are for example, 0.025" wide with a 0.25" pitch. In alternative embodiments of the invention grooves may be approximately 0.020"–approximately 0.100" in width. These dimensions are merely exemplary. Other widths and pitches may be used within the scope of the invention. Each groove 255 contains copper material 260. During the polishing process, the copper in the grooves 255 in the polishing pad 135 acts to maintain the electrochemical equilibrium over the course of the CMP process, thereby decreasing the amount of dishing that would otherwise take place.

Figure 4:
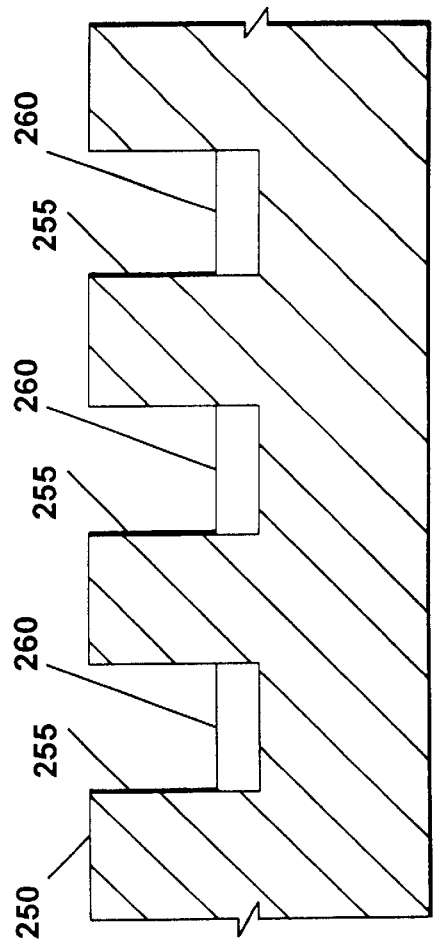
FIG. 4 is a side cross-sectional view of a first assembly of the polishing pad of FIG. 3.

FIG. 4 shows a side cross-sectional view of a first assembly of the polishing pad 245 of FIG. 3. In this assembly, grooves 255 are formed in the polishing pad first. Copper tape or wire 260 is then placed in each groove 255. In a preferred embodiment, the copper 260 lies below the surface 250 of the polishing pad, however for electrochemical purposes, the copper could fill the groove to the surface 250 of the polishing pad 245 with equal effect. Alternate ways of putting copper into the grooves 255 include electroless plating and chemical vapor deposition (CVD).

Figure 5:
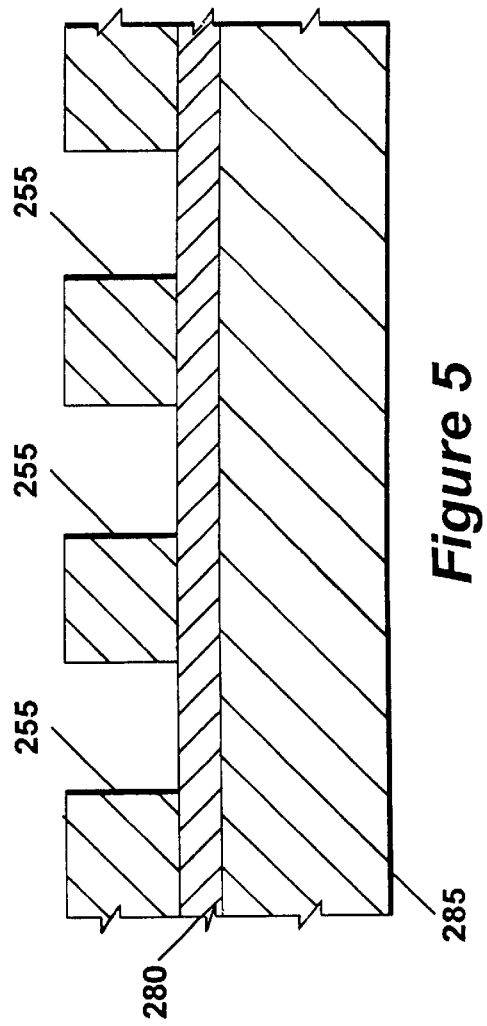
FIG. 5 is a side cross-sectional view of a second assembly of the polishing pad of FIG. 3.

FIG. 5 shows a side cross-sectional view of a second assembly of the polishing pad of FIG. 3. A layer of copper foil 280 is placed on a base 285. The polishing pad 245 with grooves 255 is then formed on top of the copper foil layer 280. A first method of forming the second assembly of the polishing pad 245 is to place a polishing pad layer on top of the copper foil layer 280. Grooves 255 are then cut into the polishing pad deeply enough to expose the copper foil layer 280. A second method of forming the second assembly is to cut the grooves in the polishing pad layer an then fixing the polishing pad to the copper foil layer. This is more readily accomplished by cutting grooves that are not complete circles leaving polishing pad spacers holding the polishing pad together.

Figure 6:
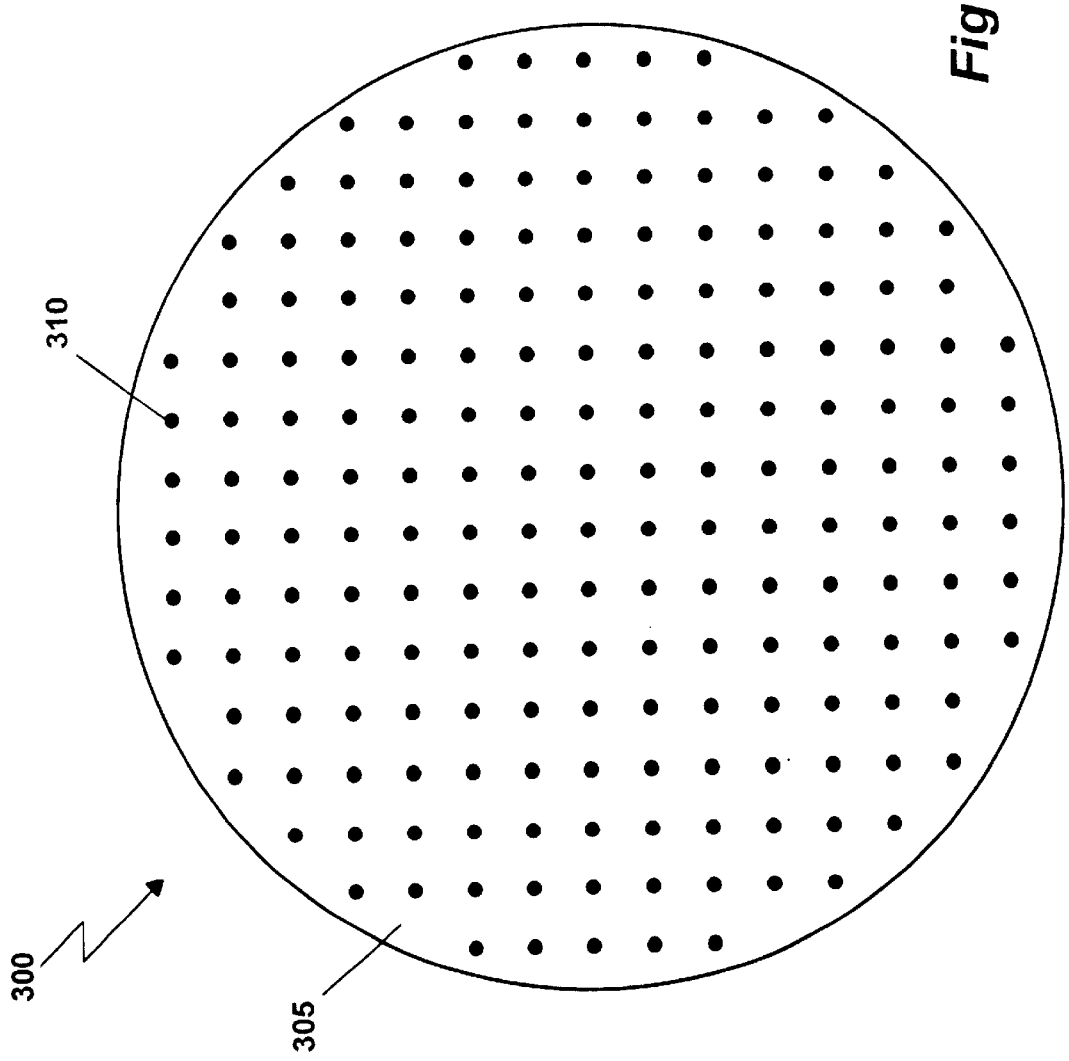
FIG. 6 is a top view of a polishing pad having perforations according to principles of the invention.

FIG. 6 shows a top view of a second embodiment of the present invention of a polishing pad 300 having embedded copper. The polishing pad surface 305 has a plurality of perforations 310. The perforations are holes that extend from the surface of the pad some distance into the pad. The density of perforations 310 in a preferred embodiment of the invention is approximately 10%–20%, however a density anywhere in the range of 5% to 50% falls within the scope of the present invention. In a preferred embodiment, each perforation (or hole) is for example 0.050" in diameter. The perforations may be in the range of approximately 0.010"–approximately 0.150" in diameter within the scope of the invention. Each perforation contains copper material. During the polishing process, the copper in the perforations acts to maintain the electrochemical equilibrium, thereby decreasing the amount of dishing that would otherwise take place.

Figure 7:
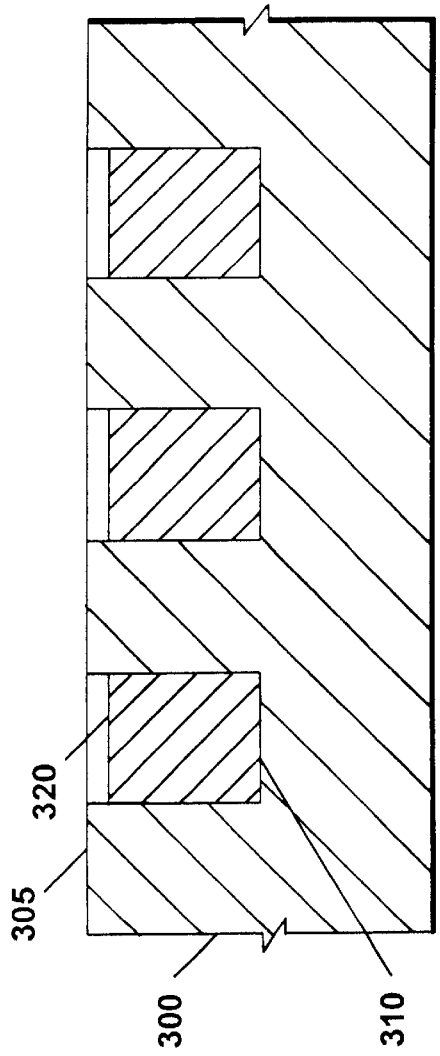
FIG. 7 is a side cross-sectional view of a first assembly of the polishing pad of FIG. 6.

FIG. 7 shows a side cross-sectional view of a first assembly of the polishing pad 300 of FIG. 6. In this assembly, the perforations, or "holes" 310, are formed in the polishing pad first. The holes 310 are then filled with copper material 320. The holes 310 can be formed by drilling or chemical etching. The copper fillings may be introduced by CVD or electroless plating, other mechanical means.

Figure 8:
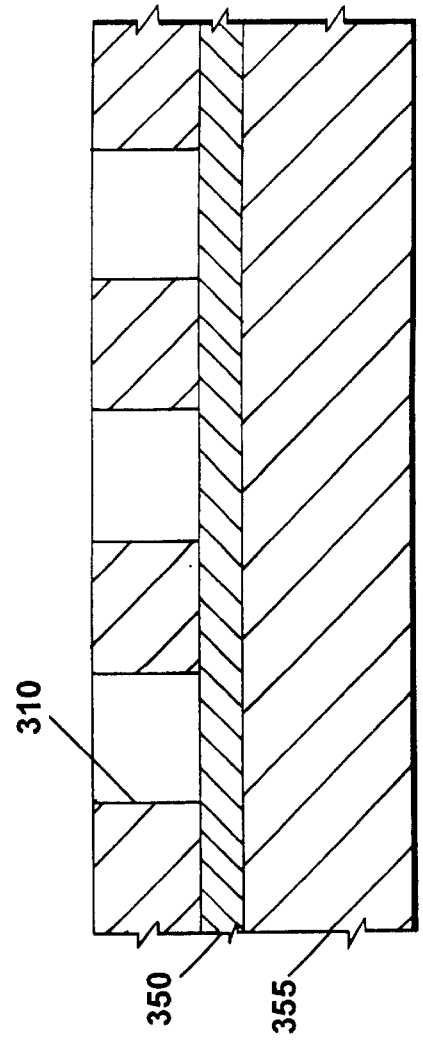
FIG. 8 is a side cross-sectional view of a second assembly of the polishing pad of FIG. 6.

FIG. 8 shows a side cross-sectional view of a second assembly of the polishing pad 300 of FIG. 6. In this assembly, a layer of copper foil 350 is placed on a base 355. The polishing pad 300 with perforatons 310 is then formed on top of the copper foil layer 350. A first method of forming the second assembly of the polishing pad 300 is to fasten an unperforated polishing pad layer on top of the copper foil layer 350. Holes 310 are then cut into the polishing pad deeply enough to expose the copper foil layer 350.

In a third embodiment of the invention, retaining rings 176, 181, 186 (shown in FIG. 2) of copper are used both alone and in combination with copper embedded in.the polishing pad.

In a fourth embodiment of the invention, a conditioning plate 162 (shown in FIG. 2) of copper is used in the polishing pad conditioner apparatus 140, 145, 150. The copper conditioning plate 162 leaves an amount of copper on the pad after conditioning thus reducing the polishing chemical to copper imbalance.

Figure 9:
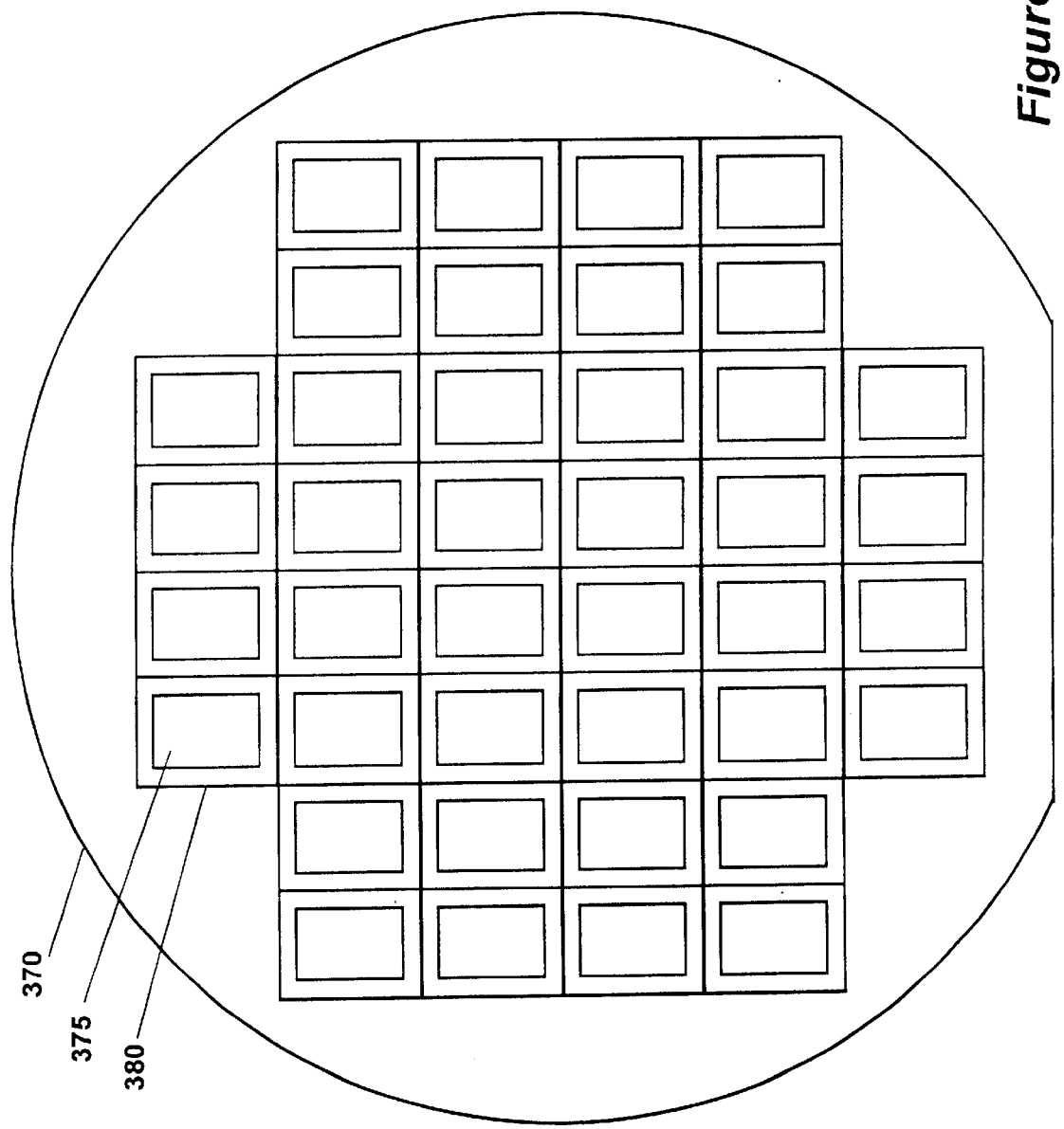
FIG. 9 is a top view of a wafer having dummy features of a metal having reductive properties according to principles of the present invention.

FIG. 9 shows a fifth embodiment of the invention in which additional areas of copper (also referred to as dummy features) are included in the metal substrate to be polished. FIG. 9 shows a wafer 370 having a plurality of components 375. Each component 375 is surrounded by a band of copper 380. The additional copper from these areas maintains the electrochemical equilibrium during the polishing process. The configuration of dummy features shown in FIG. 9 is merely exemplary. Many other possible configurations of dummy features on a substrate are included within the scope of the invention.

In a sixth embodiment of the invention, copper compounds are added to the slurry 138 (shown in FIG. 2) in order to maintain electrochemical equilibrium. The copper compounds are typically copper sulfate or some other copper salt. The copper compounds make up, for example, <1% of the slurry 138 by weight.

In further alternative embodiments of the invention, other metals, such as zinc, may be used instead of copper. Any metal that lowers reductive potential of the polishing process may be used instead of copper. The sizes and spacings of grooves and perforations provided herein are presented as examples. A wide range of dimensions could be used within the scope of the present invention. The above-described process may be used to planarize any type of patterned metal wafer.

It is to be understood that the above-described embodiments are simply illustrative of the principles of the invention. Various and other modifications and changes may be made by those skilled in the art which will embody the principles of the invention and fall within the spirit and scope thereof.

What is claimed is:

1. A polishing pad for chemical-mechanical polishing a substrate, comprising:
   a polishing surface;
   a plurality of concentric grooves formed in said polishing surface; and
   metal material embedded in at least one of said plurality of concentric grooves, said metal material having reductive properties,
   whereby said embedded metal in said polishing pad reduces dishing in chemical-mechanical polishing the substrate.

2. The polishing pad of claim 1, wherein said metal material is copper.

3. The polishing pad of claim 1, wherein said metal material is zinc.

4. The polishing pad of claim 1, wherein each said concentric groove is approximately 0.020" to approximately 0.100" wide.

5. The polishing pad of claim 1, wherein said metal material is metal tape.

6. The polishing pad of claim 1, wherein said metal material is metal wire.

7. A polishing pad for chemical-mechanical polishing a substrate, comprising:
   a base layer;
   a metal foil layer attached to said base layer; and
   a polishing pad layer attached to said metal foil layer, said polishing pad layer having a plurality of grooves, said grooves cut through said polishing pad layer exposing portions of said metal foil layer,
   whereby said exposed metal foil in said polishing pad reduces dishing in chemical-mechanical polishing the substrate.

8. A polishing pad for chemical-mechanical polishing a substrate, comprising:

a polishing surface;

a plurality of holes formed in said polishing surface; and, metal material embedded in a plurality of said holes, said metal material having reductive properties, whereby said embedded metal in said polishing pad reduces dishing in chemical-mechanical polishing the substrate.

9. The polishing pad of claim 8, wherein said metal material is copper.

10. The polishing pad of claim 8, wherein said metal material is zinc.

11. The polishing pad of claim 8, wherein said plurality of holes cover between 5% to 50% of the area of said polishing surface.

12. The polishing pad of claim 8, wherein each said hole is between approximately 0.010" to approximately 0.100" wide.

13. A polishing pad for chemical-mechanical polishing a substrate, comprising:

a base layer;

a metal foil layer attached to said base layer; and a polishing pad layer attached to said metal foil layer, said polishing pad layer having a plurality of holes, said holes cut through said polishing pad layer exposing portions of said metal foil layer, whereby said exposed metal foil in said polishing pad reduces dishing in chemical-mechanical polishing the substrate.

14. A polishing apparatus, comprising:

a polishing head having a retaining ring for retaining a substrate, said retaining ring formed from a metal having reductive properties; and a polishing pad for polishing said substrate, whereby said retaining ring having reductive properties reduces dishing in chemical-mechanical polishing.

15. The polishing apparatus of claim 14, wherein said polishing pad further comprises a polishing surface having embedded metal, said embedded metal having reductive properties.

16. The polishing pad of claim 14, wherein said embedded metal is embedded in grooves in said polishing surface.

17. The polishing pad of claim 14, wherein said embedded metal is embedded in holes in said polishing surface.

18. The polishing pad of claim 14, wherein said embedded metal is copper.

19. The polishing pad of claim 14, wherein said embedded metal is zinc.

20. A polishing apparatus, comprising:

a polishing head for holding a substrate;

a polishing pad for polishing said substrate; and a slurry delivery device for delivering slurry having copper compounds, wherein said copper compounds have reductive properties reducing dishing in chemical-mechanical polishing.

21. A polishing apparatus, comprising:

a polishing head for holding a substrate to be polished;

a polishing pad; and a polishing pad conditioning apparatus having a conditioning plate of metal having reductive properties, whereby an amount of said metal is deposited on said polishing pad during conditioning thereby electrochemical equilibrium of a polishing process is maintained.

22. A substrate for maintaining electrochemical equilibrium in a polishing process, comprising:

a conductive metal base;

a plurality of components formed on a surface of said conductive metal base;

at least one dummy feature made of a metal having reductive properties on said surface, said dummy feature to maintain electrochemical equilibrium in the polishing process.

23. A polishing pad for chemical-mechanical polishing a substrate, comprising:

a polishing surface;

a plurality of grooves formed in said polishing surface; and metal tape embedded in at least one of said plurality of grooves, said metal tape having reductive properties, whereby said embedded metal tape in said polishing pad reduces dishing in chemical-mechanical polishing the substrate.

24. The polishing pad of claim 23, wherein said metal tape is copper or zinc.

25. The polishing pad of claim 23, wherein said plurality of grooves are concentric.

26. The polishing pad of claim 23, wherein each said groove is approximately 0.020" to approximately 0.100" wide.

27. The polishing pad of claim 7, wherein said metal foil is copper or zinc.

28. The polishing pad of claim 7, wherein said plurality of grooves are concentric.

29. The polishing pad of claim 7, wherein each said groove is approximately 0.020" to approximately 0.100" wide.

30. The polishing pad of claim 13, wherein said metal material foil is copper or zinc.

31. The polishing pad of claim 13, wherein said plurality of holes cover between 5% to 50% of the area of said polishing surface.

32. The polishing pad of claim 13, wherein each said hole is between approximately 0.010" to approximately 0.100" wide.

* * * * *